INVENTOR
William B. Green
BY
L. L. Menzemer
ATTORNEY

July 18, 1967 W. B. GREEN 3,331,996

SEMICONDUCTOR DEVICES HAVING A BOTTOM ELECTRODE SILVER SOLDERED TO A CASE MEMBER

Filed March 11, 1964 3 Sheets-Sheet 3

3,331,996
Patented July 18, 1967

3,331,996

SEMICONDUCTOR DEVICES HAVING A BOTTOM ELECTRODE SILVER SOLDERED TO A CASE MEMBER

William B. Green, Greensburg, Pa., assignor to Westinghouse Electric Corporation, East Pittsburgh, Pa., a corporation of Pennsylvania Filed Mar. 11, 1964, Ser. No. 350,989
23 Claims. (Cl. 317—234)

The present invention relates to semiconductor devices, such as silicon diodes and transistors, and has particular reference to improved devices capable of withstanding repeated thermal cycling, and processes for making the same.

This application is a continuation-in-part of my application Ser. No. 11,675 filed Feb. 29, 1960 which in turn was a continuation-in-part of my application Ser. No. 726,130 filed Apr. 3, 1958, and assigned to the assignee of the present invention.

One known method for preparing a silicon semi-conductor diode comprises joining a semiconductor element, which may comprise a wafer or die of, for example, N-type semiconductor material, to a base contact member which may comprise any suitable metal such as molybdenum, tantalum, tungsten or the like. The base contact member may be provided with a metal coating, of for example, silver or nickel, to facilitate soldering the same to the semiconductor element. A suitable solder for joining the base member and the semiconductor element may comprise any silver, gold, tin, aluminum or the like, base ohmic solder. A counterelectrode which may comprise any suitable metal, such tantalum, tungsten, molybdenum or the like is then joined to the semiconductor element by a solder which produces a P-N junction in the semiconductor wafer. The composition of the last mentioned particular solder for joining the counterelectrode and semiconductor element is chosen with reference to the particular semiconductor material empolyed. When the semiconductor element is of the N-type, an aluminum base solder which may contain silicon has been found to be particularly satisfactory. After assembly, the semiconductor device is then soft soldered or otherwise sealed, into a metal case to protect it, to provide mechanical support and to facilitate subsequent connections. A tin-lead solder, having a melting point in the range of 230° C. to 300° C. has been usually employed to effect this last-mentioned solder connection.

It has been commonly assumed that silicon semiconductor devices prepared in the manner stated above will have an almost indefinite life. However, this has not proven to be the case. Actual industrial use has revealed that silicon devices prepared as described above have a limited life due to fatigue rupture of the tin-lead solder used to join the base contact member to the case. In many cases failure has occurred after a relatively short period of use under thermal cycling conditions.

The object of the present invention is to provide a semiconductor device capable of withstanding indefinitely service conditions such as alternate temperature changes as the device is subjected to successive application and interruption of flow of electrical current, by correlating the dimensions of a supporting electrode to the semiconductor wafer hard soldered thereto and a hard solder composition disposed between the supporting electrode and an enclosing case.

A further object of the present invention is to provide silicon semiconductor diode and transistor devices that are capable of withstanding indefinitely service conditions such as alternating temperature changes resulting from successive application and interruption of current to the device, wherein the dimensions of a silicon wafer are correlated to a supporting electrode to which it is hard soldered, and a hard solder bonding the supporting electrode to an enclosing case.

Another object of the present invention is to provide a semiconductor device capable of withstanding indefinitely cyclic temperature changes in service, by joining the semiconductor wafer by a hard solder to a relatively thick metallic support contact member of a metal having a coefficient of thermal expansion substantially that of the wafer, and hard soldering the support member to a pedestal of an enclosing case which has a greatly different coefficient of thermal expansion than the semiconductor wafer.

Other objects of the invention will, in part, be obvious and will, in part, appear hereinafter.

For a better understanding of the nature and objects of the invention, reference should be had to the following detailed description and drawings, in which.

Figure 1:
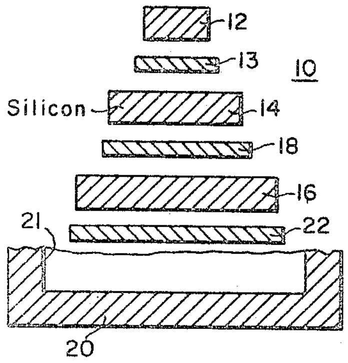
FIGURES 1 and 2 are exploded, cross-sectional views of several different assembly modifications of semiconductor devices illustrating various structural aspects of this invention.

In accordance with the present invention and attainment of the foregoing objects, there is provided:

A semiconductor device comprised of a wafer of semiconductor material of substantial area, the wafer being of silicon, silicon carbide or III–V compound, a supporting electrode member of an area not materially smaller than that of the wafer, the supporting electrode being of a metal selected from the group consisting of tantalum, molybdenum, tungsten and base alloys thereof, and having a coefficient of thermal expansion substantially equal to that of the wafers and good electrical and thermal conductivity, the thickness of the supporting electrode being from 20 to 200 mils and having a diameter to thickness of from 5:1 to 15:1 and a hard solder melting above 375° C., and preferably above 500° C., bonding the wafer to the supporting electrode and also bonding the supporting electrode to an enclosing case, the supporting electrode preferably being mounted on a pedestal of an area substantially coextensive with that of the supporting electrode.

The hard solders of this invention for bonding the semiconductor wafer are comprised essentially of at least one metal of the group consisting of aluminum, gold, silver, and copper. The solders may include minor proportions of gallium, boron, lead, arsenic, antimony, silicon, phosphorus, germanium, indium and tin. Gallium, indium and boron may function as p-type doping impurities, while phosphorus, arsenic and antimony may function as n-type doping impurities, in the solder, to convert a part of the wafer to which the hard solder is applied to an opposite type of semiconductivity. The tin, lead, silicon and germanium are neutral components and may be employed in silver, copper and gold base solders to provide a neutral hard solder when such is desired. Aluminum functions as a p-type doping impurity and is employed to convert to p-type conductivity the surfaces of an n-type wafer to which it, or aluminum base alloys, are applied. It will be understood that solders without silicon, for example, may dissolve silicon from silicon wafers to which they are applied, and accordingly in a completed device the solder will include such dissolved silicon. Thus a gold solder which melts at very high temperatures when applied to a silicon wafer and heated will dissolve silicon and form, at least at the area of contact, a gold-silicon eutectic which melts at about 375° C. Except for a few eutectics such as gold-silicon, all the hard solder compositions melt well above this temperature, and, in fact, nearly all melt above 500° C.

The hard solders of this invention have characteristics materially different from soft solders, such as the lead and tin solders. The hard solders of this invention possess such higher physical properties such that prolonged thermal cycling will not cause fatigue and failure of joints made therewith. The higher temperatures employed with the hard solders effect better alloying with the metal surfaces and as a consequence better joints are produced.

More particularly the invention relates to improved semiconductor diode devices comprised of (1) a counterelectrode contact, said counterelectrode contact being comprised of a metal selected from the group comprised of tantalum, tungsten and molybdenum and base alloys thereof, (2) a thin semiconductor wafer having one surface bonded by a hard solder to the counterelectrode contact, said semiconductor wafer comprised of a semiconductor material having predetermined conductivity selected from a group consisting of silicon, silicon carbide, and semiconducting compounds of group 3 and 5 elements, (3) a layer of a first solder fusible above 375° C. disposed between the counterelectrode contact and the wafer and bonding them to each other, for a silicon the said first solder is preferably comprised essentially of aluminum, and may include silicon, as minor components, (4) a base contact forming a supporting electrode is bonded to the other surface of the semiconductor wafer, said base contact being of an area not significantly less than that of the wafer and comprised of a metal selected from the group consisting of tantalum, molybdenum and tungsten and base alloys thereof, the base contact preferably having a thickness of from 20 to 200 mils, said base contact having a diameter to thickness ratio in the range of 5:1 to 15:1, (5) a second hard solder disposed between the said second surface of the wafer and the base contact and bonding the wafer to the base contact, said second solder having a melting point above 375° C., (6) a metallic mounting base of a case enclosing the base contact, the mounting base being comprised of, for example, copper, copper base alloys and steel, and (7) a third layer of hard solder between the base contact and the upper surface of the case, the third solder having a melting point above 375° C. and preferably above 500° C. While the term "diameter" is applied to the base contacts, it should be understood that while circular members are ordinarily contemplated and will be employed, other geometrical shapes such as square, hexagon and octagon, may be employed, in which event the "diameter" indicates the extreme diagonal dimension of the shape.

It will be understood that in the diodes the counterelectrode contact will be hard soldered to a flexible lead member at the same time as the assembly of members (1) to (7), above described, is prepared. Therefore, a layer (8) of a hard solder melting above 375° C. and corresponding in composition to the third layer (7) of hard solder will be applied to the upper surface of the counterelectrode, and a flexible lead (9) of copper, bronze or other electrical conductor will be bonded by the solder (8) to the counterelectrode.

The mounting base will usually comprise a well, either in the form of a depression or a groove machined therein or formed by a ring soldered to the mounting base.

The best results have been obtained when the base contact is hard soldered to a pedestal on the mounting base. The pedestal may be of the same area as the base contact, or slightly smaller or larger. The height of the pedestal is similar or comparable to the thickness of the base contact.

The case will comprise a protective enclosure which will be disposed around the active elements of the entire semiconductor device and soldered or welded to the base.

The present invention may be successfully applied to producing transistors highly resistant to thermal fatigue. The transistors will comprise a semiconductor wafer of substantial area, a collector being formed on the bottom surface of the wafer, the emitter will be usually applied to the upper surface and may be centrally disposed or may comprise one or more rings or strips, while the base region may comprise other areas of the upper surface; a supporting electrode of substantially the size of the collector area is hard solder to the collector region, the supporting electrode being composed of tantalum, tungsten, molybdenum and base alloys thereof, the supporting electrode is hard soldered to a supporting case of copper, copper base alloys or steel, directly or upon a pedestal of comparable area; and the emitter and base regions may be bonded by hard solders to electrical leads.

More generally, it has been found that the life of silicon semiconductor devices for instance, resulting from this invention, may be extended almost indefinitely by correlating (a) the composition and melting point of the solder utilized to bond the supporting electrode to the case or mounting base member and (b) by the structural configuration and proportions of the mounting base and supporting electrode.

Referring to the drawing, FIGURE 1 illustrates one type of a semiconductor diode device 10 utilizing the teachings of this invention. The semiconductor device 10 includes a counterelectrode member 12, which may comprise any suitable metal such as molybdenum, tungsten, tantalum and base alloys of these metals such as 3% to 20% of either silver or copper and the balance tungsten, joined to a wafer 14 of semiconductor material, which may be comprised of any suitably doped semiconductor material such as silicon, silicon carbide and semiconducting compounds of group 3 and 5 elements such as indium phosphide, gallium antimonide and arsenic phosphide. The wafer 14 may be entirely of either N-type or P-type conductivity. In some cases, it may comprise a grown or diffused P-N junction die. A hard solder 13 melting at 375° C. and higher is disposed upon wafer 14. The solder may be neutral or may be capable of producing N-type or P-type conductivity in the wafer 14 and may be used with either N-type or P-type semiconductor material. The solder 13 may be, for example, an aluminum-silicon alloy comprising 89% by weight aluminum and 11% by weight silicon, which has been found to be particularly satisfactory for bonding to N-type silicon and will produce by alloying a P-type layer therein. The layer of solder 13 should have a thickness in the range of up to 6 mils, and can be as low as about 0.1 mil.

The semiconductor wafer 14 is joined to a base electrode metal contact 16 by a suitable hard solder 18. The base electrode contact 16 may be comprised of any suitable metal, for example, a metal selected from the group consisting of tantalum, molybdenum, tungsten and base alloys thereof as is employed for counterelectrode 12. In accordance with the teaching of this invention and for reasons discussed herein, the base contact 16 has a diameter to thickness ratio in the range of 5:1 to 15:1. The diameter of the base contact 16 is dependent upon the diameter of the semiconductor wafer 14 since the base disk 16 should be approximately coextensive with the semiconductor wafer 14, and usually may be of the same size or slightly larger to ensure best functioning of the device.

The hard solder 18 has a melting point in the range of 375° C. to 850° C. and even higher, and is comprised of a major proportion of at least one metal selected from the group consisting of gold, copper and silver and a minor proportion of at least one metal selected from the group consisting of lead, tin, antimony, phosphorus, arsenic, silicon and germanium: for example, (a) 97% by weight silver, 2% by weight lead and 1% by weight antimony; (b) 99% by weight gold and 1% by weight antimony; (c) 90% silver and 10% tin; and (d) 72% silver, 27% copper and 1% antimony. In practice, the solder 18 is usually cold rolled into a foil having a thickness in the range of about 1 to 6 mils, and disposed between the semiconductor wafer 14 and the base contact 16 when the device 10 is assembled.

The base contact 16 is joined to a supporting case member 20 by a hard solder 22. The hard solder 22 has a melting point above 375° C. and is comprised of at least one metal selected from the group consisting of gold, copper, aluminum, and silver and base alloys thereof. The alloys may comprise from 0.5% and up to 10% by weight of at least one of the group of phosphorus, germanium and silicon and may also contain small amounts of other metals such as lead, copper and tin in amounts of up to 5%. The silicon, germanium or phosphorus component in this solder appears to behave similarly to a soldering flux insofar as each will react with oxides or any impurities on the surface of the base contact 16 and the supporting case member 20 to form soluble oxides.

The composition of solder 22 is of such a nature that it will not rupture at the inner faces of the solder and base contact, the solder and case member or within its own cross-sectional area from cyclic temperature changes resulting from repeatedly heating the device 10 to temperature in its operating temperature range and then allowing it to cool to room temperature. Examples of suitable solder compositions include, 96% by weight silver, 2% by weight lead and 2% by weight silicon; 95% silver and 5% germanium; 72% silver, 27½% copper and ½% phosphorus; and 98% by weight gold, 2% by weight silicon.

The solder layer 22 after fusion in the assembly has a thickness in the range of up to 6 mils.

The case member 20 provides for a heat sink and carries electrical current, and it has an area greater than base member 16. Member 20 is comprised of a reasonably good conductive thermal and electrical metal such as copper, copper base alloys, steel and ferrous base alloys thereof. The case member 20 which may be of any suitable geometric configuration and shape, is provided with a well 21 in keeping with its function. The well may be cylindrical, rectangular or of square cross section. The case member 20, provides mechanical support for the semiconductor elements proper and provides means to which electrical connections (not shown) can be made. Also hermetic encapsulating shells may be soldered or welded to the periphery of the member 20.

The diode assembly 10 of this invention is so organized that it may be united into an integral device in a single heating operation. Previously, in preparing diode devices, two or more separate heating operations were required to solder and bond the wafer to the electrodes, and then to bond this partially complete structure to a support member, and finally to solder leads to the counterelectrode.

In completing the assembly into an operative unitary structure by one suitable process the device 10 described above, is placed on a conveyor belt and passed into a furnace. The furnace, which may be of a tunnel-like configuration, has a hydrogen atmosphere which is maintained by a constant flow of hydrogen into the furnace. The furnace has at least two zones: in a first zone, provided with heating means, the device of FIGURE 1 is heated to a temperature of at least 400° C. or such temperature above the melting point of the solder whereby the various solder layers are softened and wet the materials between which they are disposed. This heating process may be carried out in the space of a few minutes. The device then passes into a second or cooling zone where the device is rapidly cooled below the solidus temperature of the various solders, whereby the device is bonded into a unitary structure in a single operation. The cooling rate is not considered critical, and good results have been realized when the device is cooled from approximately 700° C. to 100° C. in about 30 minutes. Other furnace devices may be employed, and at least one will be described later.

It has been found that by utilizing a base contact 16 with the configuration described above, and effecting the joint between the case member 20 and base contact 16 with the hard solder of the type described above, it is possible to minimize substantially all the rupture-producing deformation and strain resulting from the relative thermal expansion and contraction of these components of the device during operation, so that the device will operate almost indefinitely without failure.

It has been found that when the thickness of the supporting base of the case member 20 is less than the thickness of the base contact 16, the case member may comprise a flat surface of indefinite extent beyond the area of the base contact disposed thereon. When the base contact 16 is kept within the thickness to diameter ratio range of 1:5 to 1:15, detrimental bimetallic deformation of the base member and case member is substantially eliminated.

Figure 2:
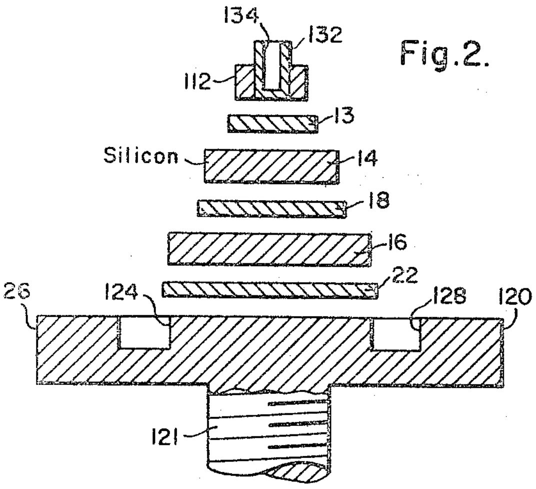

Referring to FIG. 2, it has been found, further, that when the thickness of case member is equal to or greater than the thickness of base contact, the best results are obtained when the case member is provided with a pedestal 124 to which the base contact is soldered. The pedestal 124 has a height comparable to the thickness of the contact 16 above the plane of a well or circumferential depression 128 in case member 120. Also, as shown in FIG. 2, the pedestal 124 is disposed within a well in the case member 120. The well may be formed by side walls 126 which are integral with the pedestal and the rest of the case member. A well may be provided by a ring member which is hard soldered or welded to the surface of the case member about the pedestal. The area of the entire well is greater than the area of base contact 16. The upper surface of the pedestal is approximately coextensive with the bottom surface of the base contact, and it is to this upper surface that the base contact is joined with the hard solder 22. The case 120 may have a stud 121 projecting from its bottom outer surface to facilitate making electrical connection to the device and/or connecting the device to a heat dissipating means.

The counterelectrode contact 112 is comprised of a metal selected from the group comprising molybdenum, tungsten, tantalum and base alloys thereof, and is disposed completely about the integrally bonded or fitted to a closed end metal tube 132 which has an opening 134 at the top. The metal tube is comprised of a metal selected from the group consisting of copper, copper base alloys and steel. A pigtail connection (not shown) may be crimped mechanically, soldered or otherwise joined within the opening 134 of the metal tube 132.

Figure 3:
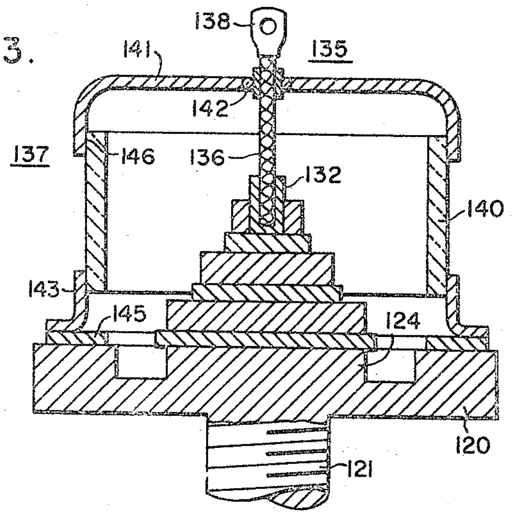
FIG. 3 is a side view in cross section of an assembled and encased semiconductor device prepared in accordance with the teachings of this invention.

With reference to FIG. 3 there is illustrated the device of FIG. 2 with a terminal 135 affixed thereto and hermetically sealed within a protective container 137.

The terminal 135 is comprised, for example, of a copper pigtail braid 136 and a solid metal tip 138 affixed to one end of the braid. The tip 138 can be joined to the braid 136 by crimping, soldering or the like. The other end of the braid 136 is inserted in the cavity 134 of the cup 132 and joined thereto by soldering or crimping.

The protective container 137 is formed in part by the case member 120, a porcelain sleeve member 140, and a metal top member 141. The tip 138 passes through a glass-to-metal seal 142 in the top member 141. The porcelain member 140 is soldered to a metal flange 143, which is welded to a steel ring 145 which in turn is soldered to the case member 120. The porcelain member 140 is also soldered to the top member 141. The metal top member 141 and flange 143 may be of steel or a nickel-cobalt-iron alloy known as Kovar.

Figure 4:
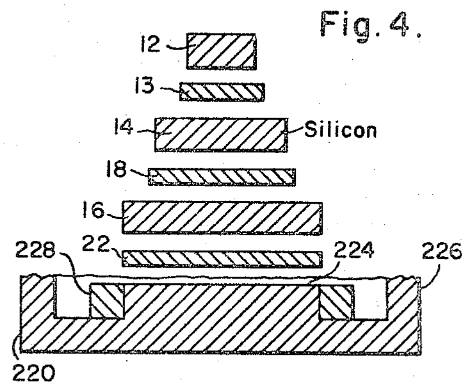
FIGS. 4 through 7 are exploded, cross-sectional views of different modifications of semiconductor devices illustrating the various structural aspects of this invention.

Reference should be had to FIGURE 4 for a modification of the pedestal feature shown in FIGURE 2. A ring member 228, having the same inner geometric configuration as a pedestal 224, the ring member being comprised of a metal selected from the group consisting of molybdenum, tungsten, tantalum and base alloys thereof, is disposed completely about and integrally bonded or shrink fitted to the pedestal 224. As the temperature of the device rises and the pedestal begins to expand, its expansion in the horizontal plane is restrained by the expansion coefficient of the ring member 228 with the result that substantially all the deformation is restricted to a vertical direction which markedly minimizes the stress and resultant strain on the joint between the base contact 16 and the pedestal 224.

Figure 5:
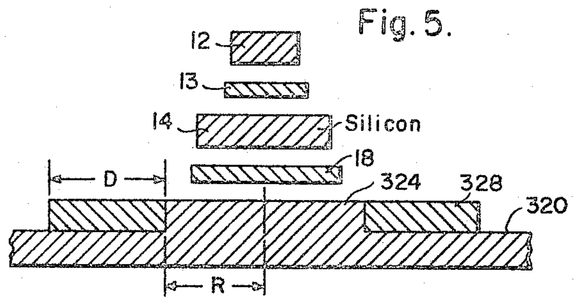

In a modification of the present invention, it has been found that the restraining ring construction of pedestal 224 of FIGURE 4 is such that it may serve as the base contact for the device to which the wafer is soldered, even though it is of a metal whose coefficient of thermal expansion differs greatly from that of the wafer 14. This modification is shown in FIGURE 5 in which a metal ring 328 comprised of a metal selected from the group consisting of tantalum, tungsten, molybdenum and alloys thereof, is disposed completely about and integrally bonded or shrink fitted to a pedestal 324. The pedestal 324 is integral with and disposed upon a support member 320. Both the support member and pedestal may be comprised of copper, copper base alloys, and steel or other suitable ferrous metal alloys. The pedestal is joined to the semiconductor wafer 14 by a hard solder 18 and the restrained pedestal serves as the base contact of the device. In this modification the ring 328 serves to restrain horizontal expansion of the pedestal. For good results, the annular dimension (D) of the ring must be equal to or greater than the radius (R) of the pedestal 324. The modification of FIG. 5 is advantageous in that it enables the direct positioning of a good thermal and electrical conductor such as copper in the pedestal to the semiconductor wafer.

Figure 6:
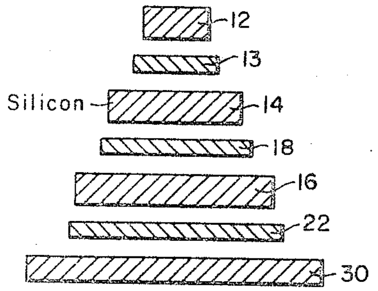

For still another modification of the present invention, reference should be had to FIG. 6. In industrial applications, the situation will frequently arise when, because of flexibility or weight restrictions or because of a low power application, it is not possible nor necessary to utilize a case member of the types shown in FIGURES 1 to 5. In such cases, a flat sheet or strip 30 of copper, steel or other metal, having a thickness in the range of 5 mils to 100 mils may be employed as a support. In such devices, thermal fatigue can be minimized if the base contact 16 of tantalum, tungsten, molybdenum or base alloys thereof, has a diameter to thickness ratio in the range of 10:1 to 20:1 and the strip member 30 is thinner than the thickness of contact 16. The contact 16 has a diameter approximately equal to or somewhat greater than wafer 14.

Figure 7:
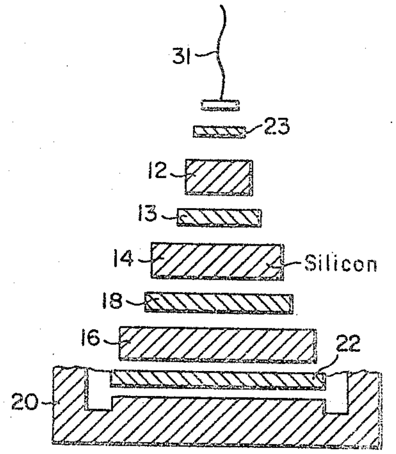

With reference to FIG. 7, this invention is also applicable to effecting a connection between the counterelectrode 12 and separate flexible lead member 31. In such devices, the flexible lead member is joined to the counterelectrode 12 by means of a hard solder layer 23 which is of the same nature and type as the hard solder layer 22. The flexible lead member 31 in the form of a nail is comprised of a metal selected from the group consisting of tantalum, tungsten, and molybdenum. The lead member may also comprise a disk of the metal with a copper braid hard soldered thereto.

Figure 8:
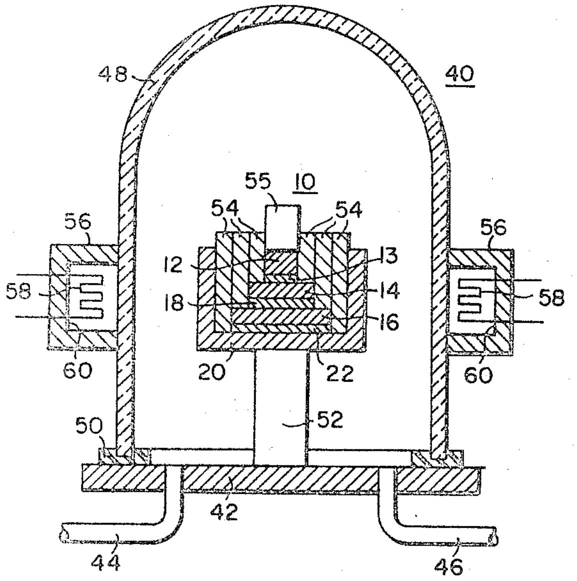
FIG. 8 is a view, in cross section, of a semiconductor device positioned for assembly in a vacuum furnace.

The use of the hard solders 22 and 23 with a melting point above 375° C. makes possible the assembly of the semiconductor device of this invention to base member in one step. The heating may be carried out in a bell-type furnace as shown in FIGURE 8. With reference to FIG. 8, the device of FIG. 1 with components stacked in order, as shown, is placed in a furnace 40. The furnace comprises a platform 42 through which passes a conduit 44 connected to a pump or other source capable of producing a high vacuum and another conduit 46 for introducing a protective gas, such as hydrogen nitrogen, helium, argon, or the like, and for breaking the vacuum that may be created in the furnace. The furnace proper comprises a bell 48 of a heat resistant glass as, for example, a 96% silicon dioxide glass, fitting into a sealing joint 50 applied to the platform 42. The assembly 10 of FIG. 1 is mounted on a refractory support 52 on the base 42. A series of spacers 54 of a high melting point, non-reactive metal or other material, such as graphite, are applied on and about the device 10 to position the parts with respect to the case 20. A weight 55 of a metal, such as molybdenum, is applied to the counterelectrode to apply a suitable light pressure to the assembly. In encircling heater 56 comprising an induction heating or radiant coil 58 disposed within an annular groove 60 is adapted to be lowered about the bell 48 in order to heat the components of assembly 10.

The weight 55 and spacers 54 may apply from approximately 20 grams to 500 grams per square inch of the silicon wafer surface being fused to the base contact. Good results have been obtained by employing a weight of 5 grams for a one-quarter inch diameter silicon wafer. Up to 50 grams have been applied to one-quarter inch diameter silicon wafers with good results.

In practice, a number of assemblies 10 were placed on graphite supports 52, placed the bell 48 thereover in position in the gasket 50 and evacuated the space within the bell 48 through the conduit 44. The gas pressure within the bell is reduced to a value of less than 10 microns. Heat is then radiated to the assembly 10 by energizing the resistance heating element 58. Usually, heating causes evolution of gases from the members and evacuation is continued through the operation. A thermocouple (not shown) is placed adjacent the assembly 10 in order to determine the temperature thereof.

The temperatures giving satisfactory bonding of the assembly 10 have been from 400° C. to 1000° C. If layer 18 comprises an aluminum or aluminum alloy, it will not properly wet silicon and molybdenum until temperatures of at least about 570° C. are attained, and a temperature of 800° C. and higher is usually required for best results. Particularly good results have been obtained when the temperature of the furnace was controlled so that assembly 10 reached a peak of from 870° C. to 925° C. Such peak temperatures are held for a brief period of time, ordinarily not over a minute, and the temperature is then promptly reduced. No particular differences have been found in the quality of diodes wherein the rate of heating, and the corresponding rate of cooling, were varied to such an extent that the temperature rise from 100° C. to 875° C. took place in as short a time as 5 minutes or as long as 60 minutes. We have found that the silver and gold base hard solders of the present invention wet both silicon and molybdenum rapidly and dissolve a small amount of the silicon in a short while after they reach their melting point; holding for any prolonged time while the gold or silver alloy is fused is possible, but does not produce any particularly beneficial results.

Figure 9:
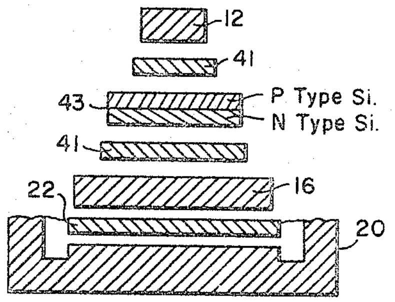
FIGS. 9 and 10 are exploded, cross-sectional views of two different semiconductor devices illustrating various structural aspects of this invention; and, FIGS. 11 and 12 are side views, in cross-section, of transistors prepared in accordance with the teachings of this invention.

In addition to the above relating to preparing devices from N-type or P-type silicon wafers, the teachings of this invention are applicable to preparing a device from a wafer containing both an N-type and P-type layer, either grown or diffused, to provide a P-N junction therein, as shown in FIG. 9. In such a device, a grown or diffused silicon wafer 43 having a P-N junction therein, is bonded at one surface to the counterelectrode 12 and bonded at the second surface to the base contact 16. The bonding at both faces may be accomplished with a neutral hard solder 41. Examples of suitable neutral solders are 96% by weight silver, 2% by weight lead and 2% by weight silicon; pure gold; and 98 gold–2% tin.

Figure 10:
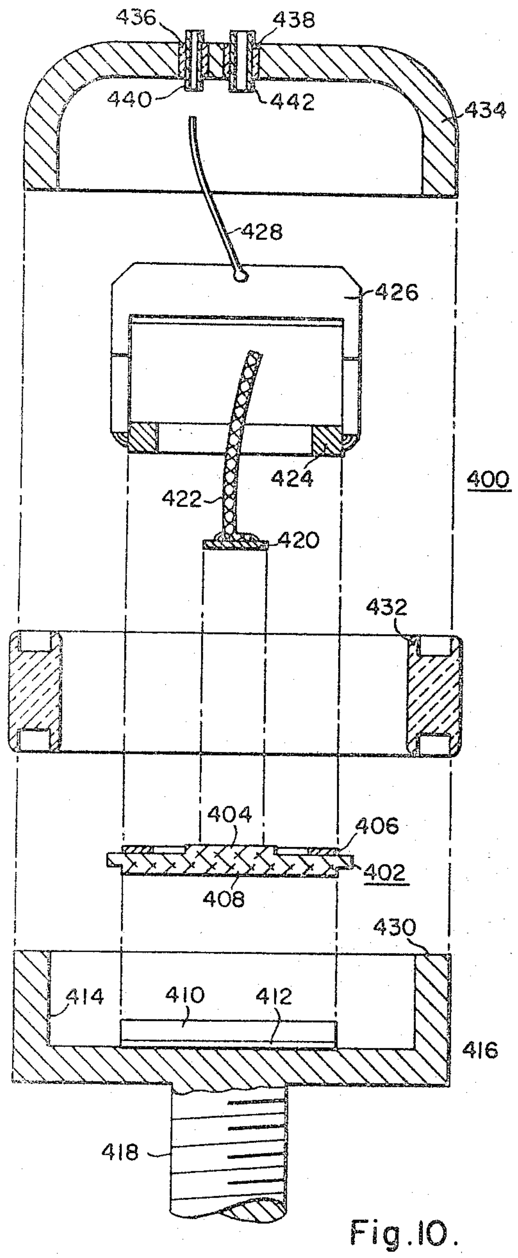

The construction of fatigue-resistant semiconductor devices in accordance with this invention may be applied to transistors and two and three or more terminal semiconductor switches, and the like, as well as to diodes. Referring to FIG. 10, there is shown an exploded view of a transistor assembly 400 embodying the principles of the invention. A wafer 402 of P-type silicon, for example, is processed to provide on the upper surface an emitter layer 404 comprising an alloy of a hard solder such as gold or silver and a doping component such as antimony, arsenic or phosphorus; a base ring 406 which may comprise a ring of metal surrounding the emitter layer and bonded by a hard solder such as a gold–1% boron solder; and on the bottom surface a collector layer 408 which may comprise a hard solder such as that used for the emitter layer. The wafer 402 may be prepared prior to the assembly. Other configurations of the emitter and base layers may be employed, for example they may comprise a plurality of alternating strips or concentric circles in which every other one may be an emitter.

The prepared transistor wafer 402 is then placed on a collector electrode 410 which is of a diameter approximately equal to or larger than the area of the collector layer 408. The collector electrode 410 is comprised of molybdenum, tungsten, tantalum or base alloys thereof. The collector electrode 410 is placed on a hard gold layer 412 and disposed within a well 414 of a case member 416. A threaded stud 418 is provided to enable case member 416 to be attached to a current source and heat sink member. An emitter electrode 420 comprising a disk of tungsten, molybdenum or tantalum, which may be plated with gold, is placed upon the emitter layer 404. The electrode 420 has a flexible lead 422 hard soldered to its upper surface. A ring base electrode 424 comprising tungsten, molybdenum or tantulum is disposed on the base ring 406. The base electrode 424 is provided with V-shaped arm 426 hard soldered thereto, and the arm may be bent laterally so that the upper part does not touch lead 422. A flexible lead 428 is hard soldered to the arm 426. The parts so far listed are assembled and placed in a furnace and heated to a temperature to meet the solder layers to join them into a unitary body.

Figure 11:
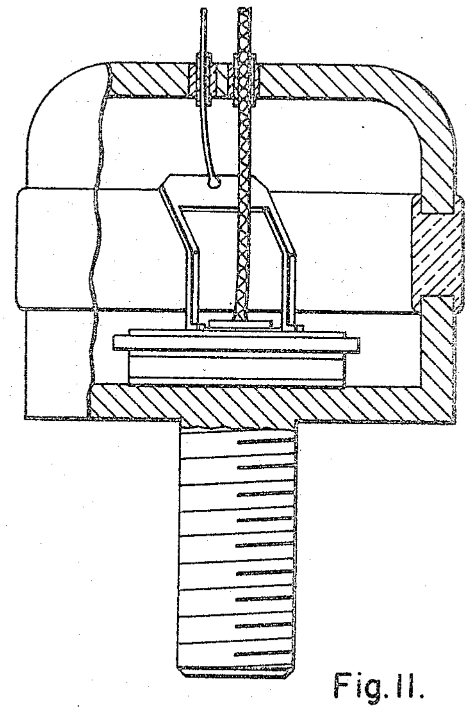

Thereafter, upon the upper surface 430 of the case member 416 is placed a ring 432 of glass or other fusible insulator, and a cap 434 of metal is disposed on the ring 432. The cap 434 contains two glass to metal seals 436 and 438 which comprise two metal tubes 440 and 442 into which leads 422 and 428, respectively are positioned. Upon heating the assembly to a temperature sufficient to melt glass ring 432, it will bond to the surface 430 and top 434. The temperature should be lower than the previously employed soldering temperature. Upon cooling the assembly, the casing comprised of top 434, glass ring 432 and case 416 is evacuated through tubes 436–438 and the casing may be filled with an inert gas. The tubes 436 and 438 are then crimped about the leads 422 and 428, and soldered. A view of the completed transistor is shown in FIG. 11.

Figure 12:
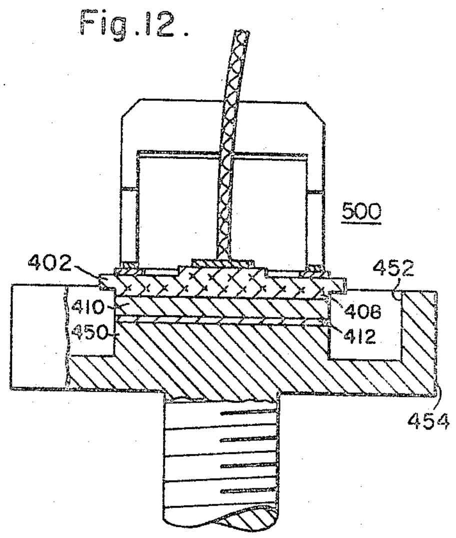

Referring to FIG. 12, there is illustrated a modified transistor construction 500, wherein the silicon wafer is mounted on a collector electrode which is hard soldered to a pedestal in the casing member. The silicon wafer 402 is hard soldered by the collector layer 408 to the collector electrode 410 which in turn is hard soldered by layer 412 to a pedestal 450 disposed in a well 452 of a casing member 454. The pedestal 450 is of approximately the same diameter as the collector electrode 410 and the collector layer 408. The construction of FIG. 12 is highly fatigue resistant and may be employed for high power transistors, such for example, as 50 ampere units.

The following examples are illustrative of the practice of this invention.

*Example I*

A circular disk of a hard solder comprised by weight of 96% silver, 2% lead, 2% silicon and with a diameter of approximately ⅝ inch and a thickness of approximately 2 mils, was placed on a coextensive copper pedestal centrally disposed upon the bottom surface of a copper case, the copper case having a base thickness of approximately ⅝ inch, the pedestal protruding approximately ⅜ inch above the upper surface of the base. A circular disk of tungsten having a thickness of approximately ⅛ inch and a diameter of approximately ⅝ inch is then placed on the disk of hard solder. A coextensive circular disk of solder having a thickness of 3 mils and comprised by weight of 97½% silver, 2% lead and ½% antimony was disposed upon the upper surface of the tungsten disk. An N-type silicon wafer having a diameter of ⅝ inch and a thickness of approximately 10 mils was disposed upon the upper surface of the silver lead antimony solder. A coextensive disk of 88% by weight aluminum and 12% by weight silicon having a thickness of about 2 mils was disposed upon the upper surface of the silicon and a molybdenum disk having a diameter of ⅜ inch and a thickness of ⅛ inch was disposed coaxially upon the aluminum-silicon solder. A coextensive disk of solder comprising by weight 96% silver, 2% lead and 2% silicon was disposed upon the molybdenum disk, and a flat bottomed copper cup of a height of approximately ½ inch was placed axially in the molybdenum disk.

The stacked components were then placed in a hydrogen furnace and a weight of 50 grams was applied to the top of the stack. The assembly was heated to 850° C. and then cooled to room temperature. The unit was examined and found to be perfect, and had no flaws or cracks. The unit was encapsulated in a hermetic case, with a flexible copper lead crimped into the copper cup.

An alternating current of 150 amperes was allowed to flow through the device from the copper pedestal to the flexible copper lead and to heat it to 185° C. The flow of current was then interrupted, and the device allowed to cool to 35° C. The device was cycled between 185° C. and 35° C. by alternately energizing the device and interrupting current flow, for 16,800 times without breakdown or any indication of thermal fatigue, and the test was terminated without any indication of impairment of its properties.

Previous comparable devices employing soft solders averaged less than 1000 cycles before rupturing.

*Example II*

The procedure of Example I is repeated using an alloy disk 2 mils thick and comprised by weight of 97½% silver, 2% lead and ½% antimony to join the N-type silicon wafer to the counterelectrode member, and an alloy disk 3 mils thick and comprised by weight of 88% aluminum and 12% by weight silicon was applied to join the silicon wafer to the tungsten base disk. This device rectified current in the opposite direction to the device of Example I. It was equally resistant to failure on cycling use.

Equally satisfactory results can be obtained with P-type silicon wafers employed in the procedure of Example I.

*Example III*

An emitter region was established by alloying a foil of 98% gold and 2% antimony of a thickness of 2 mils centrally upon the upper surface of a P-type silicon wafer having a diameter of 0.350 inch and a collector region was established by alloying a foil of a thickness of 2 mils of 98% gold and 2% antimony on the bottom surface of the wafer. An annular base contact was disposed about the emitter region and affixed to the upper surface of the wafer.

The collector region of the wafer was then placed on a molybdenum disk. The molybdenum disk was of a diameter of 0.3 inch and of a thickness of 50 mils substantially coextensive with the collector region.

The molybdenum disk and the silicon wafer were then disposed within a well in a copper case member and hard soldered to the bottom surface of the case by heating to a temperature of about 900° C. The collector layer also fused during this heating and bonded to the molybdenum disk. The hard solder employed between the case and the disk was comprised of a foil of 96% silver, 2% lead and 2% silicon.

A 20 mil thick molybdenum disk, which was substantially coextensive with the emitter region, was also hard soldered to the emitter region by heating to a temperature of about 900° C., and simultaneously, an annular contact was hard soldered to the annular base contact. The hard solder employed to join the emitter contact and base contact to the emitter and base regions was the silver-lead-silicon solder described above.

Flexible copper leads were then hard soldered to the emitter and base contacts at a temperature of about 900° C. employing the silver-lead-silicon solder.

A combination porcelain and metal cap, of the type illustrated in FIG. 3, was then welded to a steel ring soldered to the side walls of the copper case member. The flexible copper leads joined to the emitter and base contacts were passed through glass-to-metal seals in the top of the cap and the seals pinched off. Contact was made to the collector region through a metal stud projecting from the bottom of the copper case member.

Since certain changes in carrying out the above process and in the product embodying the invention may be made without departing from its scope, it is intended that the accompanying description and drawing be interpreted as illustrative and not limiting.

I claim as my invention:

1. A semiconductor device comprised of (1) a first electrode, said first electrode being comprised of a metal selected from the group consisting of tantalum, tungsten, molybdenum and base alloys thereof, (2) a semiconductor wafer having a P-N junction and having one surface bonded to the electrode, (3) a layer of a first solder fusible above 375° C. disposed between the electrode and the wafer and bonding them to each other, (4) a second electrode bonded to the other surface of the semiconductor wafer, said second electrode being of an area approximately as great as that of the wafer and comprised of a metal selected from the group consisting of tantalum, molybdenum, tungsten, and base alloys thereof, (5) a second solder disposed between the said other surface of the wafer and the second electrode and bonding the wafer to the second electrode, said second solder being comprised of at least one metal from the group consisting of gold, silver and copper and minor proportions of at least one metal selected from the group consisting of lead, phosphorus, arsenic, antimony, tin, silicon and germanium, said solder having a melting point above 375° C., (6) a support member of larger area than the second electrode having a well therein and comprised of a material selected from the group consisting of copper, copper base alloys, steel and ferrous base alloys thereof, and (7) a third layer of solder disposed between the second electrode and the upper surface of the well of the support member, said third solder having a melting point above 375° C. and comprised of a major portion of at least one metal selected from the group consisting of silver, gold and copper and base alloys thereof.

2. A semiconductor diode device comprised of (1) a counterelectrode, said counterelectrode being comprised of a metal selected from the group comprised of tantalum, tungsten and molybdenum and base alloys thereof, (2) a semiconductor wafer having one surface bonded to the counterelectrode, said semiconductor wafer comprised of a semiconductor material having N-type conductivity, (3) a layer of a first solder disposed between the counterelectrode and the wafer and bonding them to each other, said first solder being comprised essentially of aluminum, (4) a base contact bonded to the other surface of the semiconductor wafer, said base contact being of an area approximately as great as that of the wafer and comprised of a metal selected from the group consisting of tantalum, molybdenum and tungsten and base alloys thereof, said base contact having a diameter to thickness ratio in the range of 5:1 to 15:1 (5) a second solder disposed between the said second surface of the wafer and the base contact and bonding the wafer to the base contact, said second solder having a melting point above 375° C. and being comprised of a major portion of a metal selected from the group consisting of gold, silver and copper and minor proportions of at least one metal selected from the group consisting of lead, tin, antimony, arsenic, phosphorus, silicon and germanium, (6) a case member of larger area than the base contact, having a well therein and comprised of a material selected from the group consisting of copper, copper base alloys, steel and ferrous base alloys thereof, and (7) a third layer of solder disposed between the base contact and the upper surface of the well of the case member, said third solder having a melting point above 375° C. and comprised of a major portion of at least one metal selected from the group consisting of gold, silver and copper and base alloys thereof.

3. A semiconductor device comprised of (1) a counterelectrode, said counterelectrode being comprised of a metal selected from the group comprised of tantalum, tungsten and molybdenum and base alloys thereof, a lead being bonded to the counterelectrode by means of a solder melting above 375° C., (2) a semiconductor wafer having one surface bonded to the counterelectrode, said semiconductor wafer comprised of silicon having N-type conductivity, (3) a layer of a first solder disposed between the counterelectrode and the wafer and bonding them to each other, said first solder being comprised essentially of aluminum, (4) a base contact bonded to the other surface of the semiconductor wafer, said base contact being of an area at least as great as that of the wafer and comprised of a metal selected from the group consisting of tantalum, molybdenum and tungsten and base alloys thereof, said base contact having a diameter to thickness ratio in the range of 5:1 to 15:1, (5) a second solder disposed between the said second surface of the wafer and bonding the wafer to the base contact, said second solder having a melting point above 375° C. and being comprised of a major portion of a metal selected from the group consisting of gold, silver, and copper and minor proportions of at least one metal selected from the group consisting of lead, antimony, phosphorus, arsenic, tin, silicon and germanium, (6) a case member of larger area than the base contact, having a well therein and comprised of a material selected from the group consisting of copper, copper base alloys, steel and ferrous base alloys thereof, and (7) a third layer of solder disposed between the base contact and the upper surface of the well of the case member, said third solder having a melting point above 375° C. and comprised of a major portion of at least one metal selected from the group consisting of gold, silver and copper and base alloys thereof.

4. A semiconductor device comprised of (1) a counterelectrode, said counterelectrode being comprised of a metal selected from the group consisting of tantalum, tungsten and molybdenum and base alloys thereof, (2) a semiconductor wafer having one surface bonded to the counterelectrode, said semiconductor wafer comprised of a semiconductor material having N-type conductivity selected from a group consisting of silicon, silicon carbide and stoichiometric compounds of group 3 and 5 elements, (3) a layer of a first solder disposed between the counterelectrode and the wafer and bonding them to each other, said first solder being comprised essentially of aluminum, (4) a base contact bonded to the other surface of the semiconductor wafer, said base contact being of an area approximately as great as that of the wafer and comprised of a metal selected from the group consisting of tantalum, molybdenum and tungsten and base alloys thereof, said base contact having a diameter to thickness ratio in the range of 5:1 to 15:1, (5) a second solder disposed between the said second surface of the wafer and bonding the wafer to the base contact, said second solder being an ohmic solder having a melting point above 375° C. and being comprised of a major portion of a metal selected from the group consisting of gold, silver and copper and minor proportions of at least one metal selected from the group consisting of lead, phosphorus, antimony, arsenic, tin, silicon and germanium, (6) a case member, comprised of a material selected from the group consisting of copper, copper base alloys, steel and ferrous base alloys thereof, having a well therein of larger area than the base contact, said case having a base thickness comparable to the thickness of the base contact, a pedestal disposed within the well of the case member, the bottom of said pedestal being joined to the bottom of the well, the pedestal having an upper surface approximately coextensive with the bottom surface of the base contact, (7) a third layer of solder disposed between the bottom surface of the base contact and the upper surface of the pedestal and bonding them together, said third solder having a melting point above 375° C. and comprised of at least the major portion of at least one metal selected from the group consisting of gold, silver and copper and base alloys thereof.

5. A semiconductor device comprised of (1) a counterelectrode, said counterelectrode being comprised of a metal selected from the group consisting of tantalum, tungsten and molybdenum and base alloys thereof, (2) a semiconductor wafer having one surface bonded to the counterelectrode, said semiconductor wafer comprised of a semiconductor material having N-type conductivity selected from a group consisting of silicon, silicon carbide and stoichiometric compounds of group 3 and 5 elements, (3) a layer of a first solder disposed between the counterelectrode and the wafer and bonding them to each other, said first solder being comprised essentially of aluminum, (4) a base contact bonded to the other surface of the semiconductor wafer, said base contact being of an area approximately as great as that of the wafer and comprised of a metal selected from the group consisting of tantalum, molybdenum and tungsten and base alloys thereof, said base contact having a diameter to thickness ratio in the range of 10:1 to 20:1, (5) a second solder disposed between the said second surface of the wafer and the base contact and bonding the wafer to the base contact, said second solder having a melting point above 375° C. and being comprised of a major portion of at least one metal selected from the group consisting of gold, silver and copper and minor proportions of at least one metal selected from the group consisting of lead, tin, antimony, phosphorus, arsenic, silicon and germanium, (6) a metal strip comprised of a metal selected from the group consisting of copper, copper base alloys, steel and ferrous base alloys thereof said strip being of a thickness of from 5 to 100 mils and the thickness of the base contact being greater than the thickness of the strip, (7) a third layer of solder disposed between the base contact and the metal strip, said third solder having a melting point above 375° C. and comprised of a major portion of a metal selected from at least one of the group consisting of gold, silver and copper and base alloys thereof.

6. A semiconductor device comprised of (1) a first electrode, said first electrode being comprised of a metal selected from the group consisting of tantalum, tungsten and molybdenum and base alloys thereof, (2) a semiconductor wafer having at least one P-N junction and having one surface bonded to the first electrode, (3) a layer of a first solder disposed between the first electrode and the wafer and bonding them to each other, said first solder being comprised of a major proportion of a metal selected from at least one of the group consisting of gold, silver and copper, and a minor proportion of at least one metal selected from the group consisting of phosphorus, antimony, arsenic, lead, tin, silicon and germanium (4) a second electrode bonded to the other surface of the semiconductor wafer, said second electrode being of an area approximately as great as that of the wafer and comprised of a metal selected from the group consisting of tantalum, molybdenum and tungsten and base alloys thereof, said second electrode having a diameter to thickness ratio in the range of 5:1 to 15:1 (5) a second solder disposed between the second surface of the wafer and bonding the wafer to the second electrode, said solder having a melting point above 375° C. and being comprised of a major portion of a metal selected from the group consisting of gold, silver, and copper and minor proportions of at least one metal selected from the group consisting of lead, tin, antimony, arsenic, phosphorus, silicon and germanium, (6) a case member, comprised of a material selected from the group consisting of copper, copper base alloys, steel and ferrous base alloys thereof, having a well therein of larger area than the second electrode, said case having a thickness comparable to the thickness of the second electrode, a pedestal disposed within the well of the case member, the bottom of said pedestal being integral with the bottom of the well, the pedestal having an upper surface, substantially coextensive with the bottom surface of the second electrode, the area of the pedestal being substantially less than the area of the well, a restraining ring member, comprised of a metal selected from the group consisting of tantalum, tungsten and molybdenum and base alloys thereof, having a height equal to the height of the pedestal and the same inner geometric configuration as the periphery of the pedestal and disposed about and encircling the pedestal, the combined area of the pedestal and said member being less than the area of the well, (7) a third layer of solder disposed between the second electrode and upper surface of the pedestal and bonding them together, said third solder having a melting point about 375° C. and comprised of a major constituent of the second solder.

7. A semiconductor device comprised of (1) a first electrode, said first electrode being comprised of a metal selected from the group comprised of tantalum, tungsten, molybdenum and base alloys thereof, (2) a semiconductor wafer comprised in part of N-type silicon and in part of P-type silicon (3) a layer of a first neutral substantially non-doping solder disposed between the first electrode and the wafer and bonding them to each other, said first solder being fusible above 375° C., (4) a second electrode bonded to the other surface of the semiconductor wafer, said second electrode being of an area approximately as great as that of the wafer and comprised of a metal selected from the group consisting of tantalum, molybdenum, tungsten and base alloys thereof, (5) a layer of a second neutral solder fusible above 375° C. disposed between the said second surface of the wafer and the second electrode and bonding the wafer to the second electrode, (6) a case member of larger area than the second electrode, having a well therein, and comprised of a material selected from the group consisting of copper, copper base alloys, steel and ferrous base alloys thereof, (7) a third layer of solder disposed between the second electrode and the upper surface of the well of the case member, said third solder having a melting point above 375° C. and comprised of a major portion of at least one metal selected from the group consisting of silver, gold, copper, and base alloys thereof.

8. A semiconductor device comprised of (1) a first electrode, said first electrode being comprised of a metal selected from the group comprised of tantalum, tungsten, molybdenum and base alloys thereof, (2) a semiconductor wafer of predetermined conductivity having one surface bonded to the first electrode, (3) a layer of a first solder fusible above 375° C. disposed between the first electrode and the semiconductor wafer and bonding them to each other, when said semiconductor wafer has N-type semiconductivity, said first solder being comprised of a major portion of aluminum, and when said semiconductor wafer has P-type semiconductivity said first solder being comprised of gold, and at least one element selected from the group consisting of arsenic, antimony and a major portion of phosphorus, (4) a support member with a pedestal integral with and disposed upon said support member, both the support member and the pedestal being comprised of a metal selected from the group consisting of copper, copper base alloys steel and ferrous base alloys thereof, (5) a metal ring comprised of a metal selected from the group consisting of tantalum, tungsten, molybdenum and base alloys thereof, disposed completely about and integrally fitted to said pedestal, the annular dimension of the ring being at least equal to the radius of the pedestal, the pedestal being bonded to the semiconductor wafer by (6) a layer of a second solder fusible above 375° C. disposed between the semiconductor wafer and the pedestal and being comprised of a major proportion of at least one metal selected from the group consisting of gold, copper and silver and base alloys thereof.

9. The device of claim 1 in which a flexible contact member comprised of a metal selected from the group consisting of copper, copper base alloys, steel and ferrous base alloys thereof is bonded to said first electrode by a layer of solder disposed between said flexible contact and the free surface of said first electrode, said solder being fusible above 375° C. and being comprised of at least one metal selected from the group consisting of silver, gold, copper, and base alloys thereof.

10. The diode of claim 2 in which a flexible contact member comprised of a metal selected from the group consisting of copper, copper base alloys, steel and ferrous base alloys thereof is bonded to said counterelectrode by a layer of solder disposed between said flexible contact and the free surface of said counterelectrode, said solder being fusible above 375° C. and being comprised of a major portion of a metal selected from the group consisting of silver, gold, copper and base alloys thereof.

11. The device of claim 3 in which a flexible contact member comprised of a metal selected from the group consisting of copper, copper base alloys, steel and ferrous base alloys thereof is bonded to said counterelectrode by a layer of solder disposed between said flexible contact and the free surface of said counterelectrode, said solder being fusible above 375° C. and being comprised of at least a major portion of a metal selected from the group consisting of silver, gold, copper and base alloys thereof.

12. The device of claim 4 in which a flexible contact member comprised of a metal selected from the group consisting of copper, copper base alloys, steel and ferrous base alloys thereof is bonded to said counterelectrode by a layer of solder disposed between said flexible contact and the free surface of said counterelectrode, fusible above 375° C. and being comprised of at least a major portion of a metal selected from the group consisting of silver, gold, copper and base alloys thereof.

13. The device of claim 5 in which a flexible contact member comprised of a metal selected from the group consisting of copper, copper base alloys, steel and ferrous base alloys thereof is bonded to said counterelectrode, by a layer of solder disposed between said flexible contact and the free surface of said counterelectrode, said solder being fusible above 375° C. and being comprised of at least a major portion of a metal selected from the group consisting of silver, gold, copper and base alloys thereof.

14. The device of claim 6 in which a flexible contact member comprised of a metal selected from the group consisting of copper, copper base alloys, steel and ferrous base alloys thereof is bonded to said first electrode by a layer of solder disposed between said flexible contact and the free surface of said counterelectrode, said solder being fusible above 375° C. and being comprised of at least a major portion of a metal selected from the group consisting of silver, gold, copper and base alloys thereof.

15. The device of claim 7 in which a flexible contact member comprised of a metal selected from the group consisting of copper, copper base alloys, steel and ferrous base alloys thereof is bonded to said counterelectrode by a layer of solder disposed between said flexible contact and the free surface of said counterelectrode, said soldering being fusible above 375° C. and being comprised of at least one metal selected from the group consisting of silver, gold, copper, and base alloys thereof.

16. The device of claim 8 in which a flexible contact member comprised of a metal selected from the group consisting of copper, copper base alloys, steel and ferrous base alloys thereof is bonded to said first electrode by a layer of solder disposed between said flexible contact and the free surface of said first electrode, said solder being fusible above 375° C. and being comprised of at least a major portion of a metal selected from the group consisting of silver, gold, copper and base alloys thereof.

17. A semiconductor device comprised of (1) a first electrode, said first electrode being comprised of a metal selected from the group consisting of tantalum, tungsten, molybdenum and base alloys thereof, (2) a semiconductor wafer comprised in part of a zone of N-type semiconductivity and in part of a zone of P-type semiconductivity with a P-N junction therebetween, said wafer having been prepared by vapor diffusion, (3) a layer of a first neutral substantially non-doping solder disposed between the first electrode and one zone of the wafer and bonding them to each other, said first solder being fusible above 375° C., (4) a second electrode bonded to the other zone of the wafer, said second electrode being of an area approximately as great as that of the wafer and comprised of a metal selected from the group consisting of tantalum, molybdenum, tungsten and base alloys thereof, (5) a layer of a second neutral solder fusible above 375° C. disposed between the said other zone of the wafer and the second electrode and bonding the wafer to the second electrode, (6) a case member of larger area than the second electrode, having a well therein, and comprised of a material selected from the group consisting of copper, copper base alloys, steel and ferrous base alloys thereof, and (7) a third layer of solder disposed between the second electrode and the upper surface of the well of the case member, said third solder having a melting point above 375° C. and comprised of a major portion of at least one metal selected from the group consisting of silver, gold, copper and base alloys thereof.

18. A semiconductor device comprising (1) a wafer of a semiconductor material, said wafer being comprised of a base region of a first type of semiconductivity at one surface of the wafer, an emitter region of a second type of semiconductivity at said one surface of said wafer, a base contact joined to the base region and disposed upon the same surface of the wafer as the emitter region, and a collector region of the second type semiconductivity disposed upon an opposite surface of the wafer, (2) a first electrode joined to the emitter region, (3) a second electrode joined to the base contact, (4) one surface of a metallic electrical contact comprised of a metal selected from the group consisting of tantalum, tungsten, molybdenum and base alloys thereof, and being of an area approximately as great as that of the collector zone, joined to the collector region, (5) a case member of larger area than said metallic electrical contact, having a well therein, and comprised of a material selected from the group consisting of copper, copper base alloys, steel and ferrous base alloys thereof, and (6) a layer of solder disposed within the well and between the case member and the said other surface of the metallic electrical contact and joining said metallic electrical contact to said case, the solder having a melting point above 375° C. and being comprised of a major portion of at least one metal selected from the group consisting of silver, gold, copper and base alloys thereof.

19. A semiconductor device comprising (1) a wafer of a semiconductor material, said wafer being comprised of a base region of a first type of semiconductivity, an emitter region of a second type of semiconductivity at one surface of said wafer, a base contact disposed upon the same surface of the wafer as the emitter, and a collector region of the second type semiconductivity disposed upon an opposite surface of the wafer, (2) a first electrode joined to the emitter region, (3) a second electrode joined to the base contact, (4) one surface of a metallic electrical contact comprised of a metal selected from the group consisting of tantalum, tungsten, molybdenum and base alloys thereof, and being of an area approximately as great as that of the collector region, joined to the collected region, (5) a case member of larger area than said metallic electrical contact, having a well therein, a pedestal disposed within the well, the bottom of said pedestal being joined to the bottom of the well, the pedestal having an upper surface approximately coextensive with the other surface of the metallic electrical contact, and (6) a layer of solder disposed between the case member and the said other surface of the metallic electrical contact and joining said contact to said case, the solder having a melting point above 375° C. and being comprised of a major portion of at least one metal selected from the group consisting of silver, gold, copper and base alloys thereof.

20. A semiconductor device comprising (1) a wafer of a semiconductor material, said wafer being comprised of a base zone of a first type of semiconductivity, an annular emitter region of a second type of semiconductivity at said one surface of said wafer, a base contact joined to the base region and disposed upon the same surface of the wafer as the emitter region, and a collector region of the second type semiconductivity disposed upon an opposite surface of the wafer, (2) a first inverted U shaped electrode joined to two points of the emitter region, (3) a second electrode joined to the base contact, (4) one surface of a metallic electrical contact comprised of a metal selected from the group consisting of tantalum, tungsten, molybdenum and base alloys thereof, and being of an area approximately as great as that of the collector zone, joined to the collector region, (5) a case member of larger area than said metallic electrical contact, having a well therein, and comprised of a material selected from the group consisting of copper, copper base alloys, steel and ferrous base alloys thereof, and (6) a layer of solder disposed within the well and between the case member and the said other surface of the metallic electrical contact and joining said metallic electrical contact to said case, the solder having a melting point above 375° C. and being comprised of a major portion of at least one metal selected from the group consisting of silver, gold, copper and base alloys thereof.

21. A semiconductor device comprising (1) a wafer of a semiconductor material, said wafer being comprised of a base zone of a first type of semiconductivity, an annular emitter region of a second type of semiconductivity at one surface of said wafer, a base contact disposed upon the same surface of the wafer as the emitter, and a collector region of the second type semiconductivity disposed upon an opposite surface of the wafer, (2) a first inverted U shaped electrode joined to the emitter region, (3) a second electrode joined to the base contact, (4) one surface of a metallic electrical contact comprised of a metal selected from the group consisting of tantalum, tungsten, molybdenum and base alloys thereof, and being of an area approximately as great as that of the collector region, joined to the collector region, (5) a case member of larger area than said metallic electrical contact, having a well therein, a pedestal disposed within the well, the bottom of said pedestal being joined to the bottom of the well, the pedestal having an upper surface approximately coextensive with the other surface of the metallic electrical contact, and (6) a layer of solder disposed between the case member and the said other surface of the metallic electrical contact and joining said contact to said case, the solder having a melting point above 375° C. and being comprised of a major portion of at least one metal selected from the group consisting of silver, gold, copper and base alloys thereof.

22. In a three terminal semiconductor device, in combination, (1) a support member having a flat surface, the support member comprised of a metal selected from the group consisting of copper, copper base alloys, steel and ferrous base alloys thereof, (2) a flat surfaced metallic electrical contact member disposed upon the flat surface of the support member, the metallic electrical contact member comprised of a metal selected from the group consisting of tantalum, tungsten, molybdenum and base alloys thereof, (3) a flat wafer of a semiconductor material of an area not exceeding the area of the metallic contact member disposed upon the metallic contact member, (4) a layer of high melting point solder disposed between and joining the bottom surface of the wafer on the metallic contact member and the metallic contact member to the support member, the wafer of semiconductor material having a plurality of regions of different types of semiconductivity whereby at least two P-N junctions are present and the upper surface of the wafer having two regions of different semiconductivity present thereon, with one region surrounded by the other, (5) a contact joined to the said one region, (6) an inverted U-shaped electrode joined by a high melting point solder to the contact to the said one region, (7) a second electrode of a metal selected from the group consisting of tantalum, tungsten, molybdenum and base alloys thereof joined by a high melting point solder to said other region on the upper surface of the wafer, (8) a hermetical casing attached to the support member and completely enclosing the metallic electrical contact member, the semiconductor wafer, the U-shaped electrode and the second electrode and (9) two electrically-insulated conductor means passing through the walls of the casing and having flexible leads joined to the yoke of the U-shaped electrode and the second electrode, respectively, each of the high melting point solders having a melting point above 375° C. and being comprised of a major proportion of at least one metal selected from the group consisting of copper, silver, gold and base alloys thereof.

23. A semiconductor device comprised of (1) a first electrode, said first electrode being comprised of a metal selected from the group consisting of tantalum, tungsten and molybdenum and base alloys thereof, (2) a semiconductor wafer having at least one P-N junction and having one surface bonded to the first electrode, (3) a layer of a first solder disposed between the first electrode and the wafer and bonding them to each other, said first solder from at least one of the group consisting of gold, silver and copper, and a minor proportion of at least one metal selected from the group consisting of phosphorus, antimony, arsenic, lead, tin, silicon and germanium, (4) a second electrode bonded to the other surface of the semiconductor wafer, said second electrode being of an area approximately as great as that of the wafer and comprised of a metal selected from the group consisting of tantalum, molybdenum and tungsten and base alloys thereof, said second electrode having a diameter to thickness ratio in the range of 5:1 to 15:1, (5) a second solder disposed between the second surface of the wafer and bonding the wafer to the second electrode, said solder having a melting point above 375° C. and being comprised of a major portion of a metal selected from the group consisting of gold, silver, and copper and minor proportions of at least one metal selected from the group consisting of lead, tin, antimony, arsenic, phosphorus, silicon and germanium, (6) a support member having a pedestal integral therewith comprised of a metal selected from the group consisting of copper, copper base alloys, steel and ferrous base alloys, the pedestal having an upper surface substantially coextensive with the bottom of the second electrode, (7) a third layer of solder disposed between the second electrode and the upper surface of the pedestal, said third solder having a melting point above 375° C. and comprised of a major constituent of the second solder.

References Cited

UNITED STATES PATENTS 2,921,245 1/1960 Wallace et al. ------- 317—234

JOHN W. HUCKERT, *Primary Examiner.*

M. EDLOW, *Assistant Examiner.*